US008278667B2

(12) United States Patent  (10) Patent No.: US 8,278,667 B2
Murata et al.  (45) Date of Patent: Oct. 2, 2012

(54) LIGHT-EMITTING ELEMENT AND LIGHT-EMITTING ELEMENT FABRICATION METHOD

(75) Inventors: Michiaki Murata, Kanagawa (JP);
Shuichi Yamada, Kanagawa (JP);
Hiroyuki Usami, Tokyo (JP); Takahiro Hashimoto, Tokyo (JP)

(73) Assignee: Fuji Xerox Co., Ltd., Tokyo (JP)

( * ) Notice: Subject to any disclaimer, the term of this patent is extended or adjusted under 35 U.S.C. 154(b) by 242 days.

(21) Appl. No.: 12/701,743

(22) Filed: Feb. 8, 2010

(65) Prior Publication Data

US 2011/0037093 A1  Feb. 17, 2011

(30) Foreign Application Priority Data

Aug. 11, 2009  (JP) ................ 2009-186820

(51) Int. Cl.
*H01L 27/15*  (2006.01)

(52) U.S. Cl. ............... 257/79; 257/13; 257/86; 257/88; 257/91

(58) Field of Classification Search ............... 257/13, 257/79, 86, 88, 91
See application file for complete search history.

(56) References Cited

U.S. PATENT DOCUMENTS

| 2006/0001171 | A1  | 1/2006 | Ohno et al. |
| 2006/0189123 | A1* | 8/2006 | Saitou et al. ............ 438/622 |
| 2008/0230908 | A1  | 9/2008 | Igarashi |
| 2009/0004845 | A1* | 1/2009 | Gotkis et al. ............ 438/637 |
| 2009/0179215 | A1* | 7/2009 | Matsui et al. ............ 257/98 |

FOREIGN PATENT DOCUMENTS

| JP | H5-102139  | 4/1993 |
| JP | H07-030095 | 1/1995 |
| JP | H11-297697 | 10/1999 |
| JP | 2005-340767 | 12/2005 |
| JP | 2006-147749 | 6/2006 |
| JP | 2008-235728 | 10/2008 |

* cited by examiner

*Primary Examiner* — Jae Lee
(74) *Attorney, Agent, or Firm* — Fildes & Outland, P.C.

(57) ABSTRACT

According to an aspect of the invention, a light-emitting element includes a semiconductor layer, a gold electrode layer, an insulator, a barrier metal layer, and an aluminum wiring layer. The gold electrode layer is formed on a part of the semiconductor layer and is electrically connected to the semiconductor layer. The gold electrode layer being made of metal including gold. The insulator film covers the semiconductor layer and has a contact opening corresponding to the gold electrode layer. The barrier metal layer covers a an upper face of the gold electrode layer and the insulator film in a vicinity of the contact opening. The aluminum wiring layer is formed on the barrier metal layer and electrically connected to the barrier metal layer.

5 Claims, 8 Drawing Sheets

NOT-ETCHED PART IN STEP PART

LIGHT-EMITTING ELEMENT AND LIGHT-EMITTING ELEMENT FABRICATION METHOD

CROSS-REFERENCE TO RELATED APPLICATIONS

This application is based upon and claims priority under 35 USC 119 from Japanese Patent Application No. 2009-186820, filed Aug. 11, 2009.

BACKGROUND

1. Technical Field

The present invention relates to a light-emitting element and a fabrication method for a light-emitting element.

2. Related Art

Optical writing heads of optical printers or the like employ self-scanning-type light-emitting element arrays. Such a self-scanning-type light-emitting element array is constructed from a plurality of elements, which emit light sequentially. Each element includes a light-emitting thyristor of pnpn structure serving as a light-emitting element and a shift thyristor for sequentially shifting supply of electric power to each light-emitting thyristor. These components are fabricated on a compound semiconductor substrate.

SUMMARY OF THE INVENTION

According to an aspect of the invention, a light-emitting element includes a semiconductor layer, a gold electrode layer, an insulator, a barrier metal layer, and an aluminum wiring layer. The gold electrode layer is formed on a part of the semiconductor layer and is electrically connected to the semiconductor layer. The gold electrode layer being made of metal including gold. The insulator film covers the semiconductor layer and has a contact opening corresponding to the gold electrode layer. The barrier metal layer covers an upper face of the gold electrode layer and the insulator film in a vicinity of the contact opening. The aluminum wiring layer is formed on the barrier metal layer and electrically connected to the barrier metal layer. The aluminum wiring layer extends on the insulator film in a direction departing from the contact opening, and that is made of metal including aluminum.

BRIEF DESCRIPTION OF THE DRAWINGS

Exemplary embodiments of the invention will be described in detail based on the following figures, wherein.

DETAILED DESCRIPTION

Exemplary embodiments of the present invention are described below with reference to the drawings.

Figure 1:
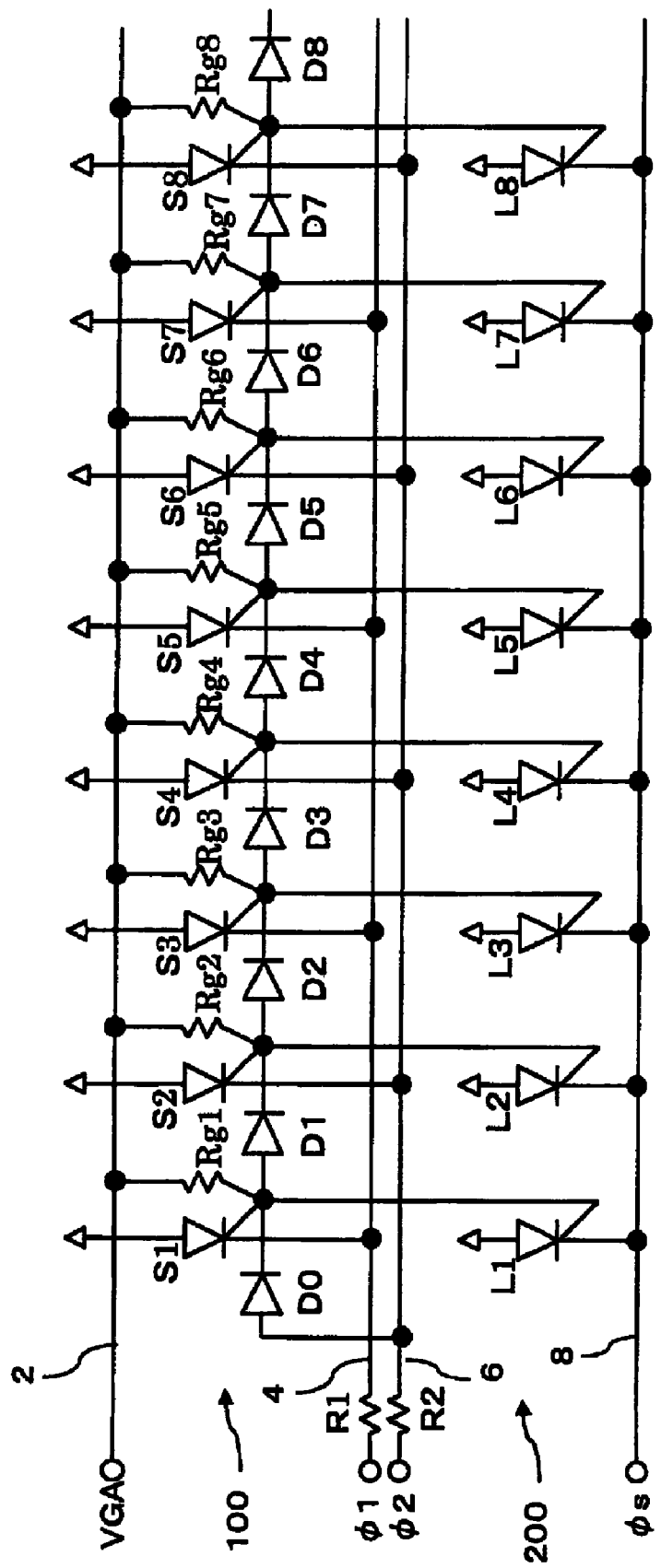
FIG. 1 is a diagram showing an equivalent circuit according to an exemplary embodiment.

FIG. 1 is an equivalent circuit diagram of a light-emitting element according to an embodiment (in the following description, a self-scanning-type light-emitting element array constructed from a plurality of light-emitting elements is also referred to as a light-emitting element). The self-scanning-type light-emitting element array includes a sift section 100 and a light-emitting section 200.

The sift section 100 includes: shift thyristors S1, S2, S3, . . . (S); coupling diodes D1, D2, D3, . . . (D) for linking the gates of the shift thyristors S with each other; and gate load resistors Rg. Here, as described later, each coupling diode D is formed as a layer fabricated together with the gate layer and the cathode layer of each shift thyristor S. Further, the gate of the first shift thyristor S1 is connected not only to the anode of the coupling diode D1 but also to the cathode of the diode DO. Furthermore, the light-emitting section 200 has light-emitting thyristors L1, L2, L3, . . . whose gates are formed in common with those of the corresponding shift thyristors S.

A power supply VGA is connected through a VGA line 2 to one end of each gate load resistor Rg. The other end of the gate load resistor Rg is connected to the gates of the corresponding shift thyristor S and the corresponding light-emitting thyristor L. A clock pulse $\phi 1$ is provided to the cathodes of the odd-number-th shift thyristors S1, S3, . . . via a current limiting resistor R1 and a $\phi 1$ line 4. A clock pulse $\phi 2$ is provided to the cathodes of the even-number-th shift thyristors S2, S4, . . . via a current limiting resistor R2 and a $\phi 2$ line 6. Further, the cathodes of the light-emitting thyristors L1, L2, . . . are connected to a $\phi s$ line 8. Here, the anodes of the shift thyristors S and the light-emitting thyristors L are connected to an anode power supply.

Further, the gate of each shift thyristor S is sequentially connected through a coupling diode D to the gate of the shift thyristor S of the next stage. Here, the gate of the first shift thyristor S1 is connected through a coupling diode D1 to the $\phi 2$ line 6.

In this specification, the self-scanning-type light-emitting element array chip shown in FIG. 7 is also referred to as an SLED (Self-scanning Light-emitting Device).

In the SLED, as the clock pulses $\phi 1$ and $\phi 2$, complementary pulse signals are employed that alternate an H level and an L level.

For example, in FIG. 1, it is assumed that the $\phi 2$ line 6 and the VGA line 2 are at an L level (−5 V), that the $\phi 1$ line is at an H level (0 V), and that the shift thyristor S2 is ON. Then, the gate of the shift thyristor S2 is approximately at an H level (approximately 0 V). At that time, the gate of the shift thyristor S3 is approximately at −1.5 V since a voltage drop of the ON-state voltage of the coupling diode D2, while the voltage of the gate of the shift thyristor S4 is approximately −3 V which is lower than the voltage of the gate of the shift thyristor S3 by the ON-state voltage of the coupling diode D3.

Then, when the $\phi 2$ line 6 goes to an H level and the $\phi 1$ line 4 becomes an L level, the shift thyristor S2 becomes OFF and the shift thyristor S3 becomes ON. Thus, the gate of the shift thyristor S3 becomes approximately 0 V. Then, the gate of the shift thyristor S4 becomes approximately −1.5 V since a voltage drop of the ON-state voltage of the coupling diode D2. Further, the gate of the shift thyristor S2 in OFF state becomes an L level equal to that of the power supply VGA through the gate load resistor Rg. As such, when the clock pulses φ1 and φ2 alternately go to an L level, the shift thyristors S sequentially go ON.

Here, at an initial step, when the φ1 line 4 is set at an L level and the φ2 line 6 is set at an H level, the shift thyristor S1 becomes ON. After that, when the φ1 line 4 and the φ2 line 6 are switched alternately between an L level and an H level, self-scan is achieved in the shift thyristors S as described above.

Here, in each light-emitting thyristor L, a signal φs is provided to the cathode. Then, when the signal φs is at an L level, a light-emitting thyristor L whose corresponding shift thyristor S is ON becomes ON. That is, when the corresponding shift thyristor S is ON, the common gate is at an H level. Thus, the light-emitting thyristor L also becomes ON. In contrast, in a case that the signal φs is at an H level, even when the corresponding shift thyristor S is ON, the cathode of the light-emitting thyristor L is at an H level and hence the light-emitting thyristor L remains OFF.

As such, in the course that the shift thyristors S sequentially go ON, when the signal φs is set at an H level or an L level, light emission of the light-emitting thyristors L is controlled.

Figure 2:
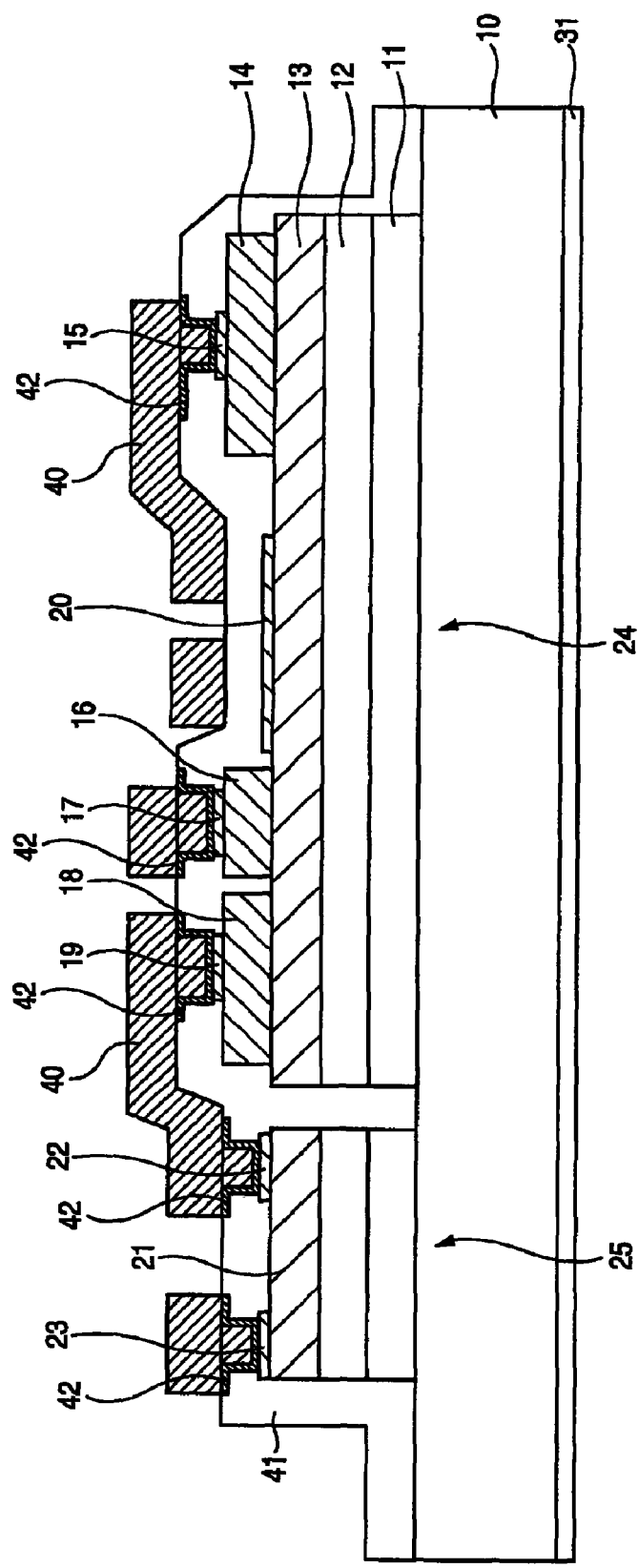
FIG. 2 is a diagram showing a sectional view of a light-emitting element according to an exemplary embodiment.
Figure 3:
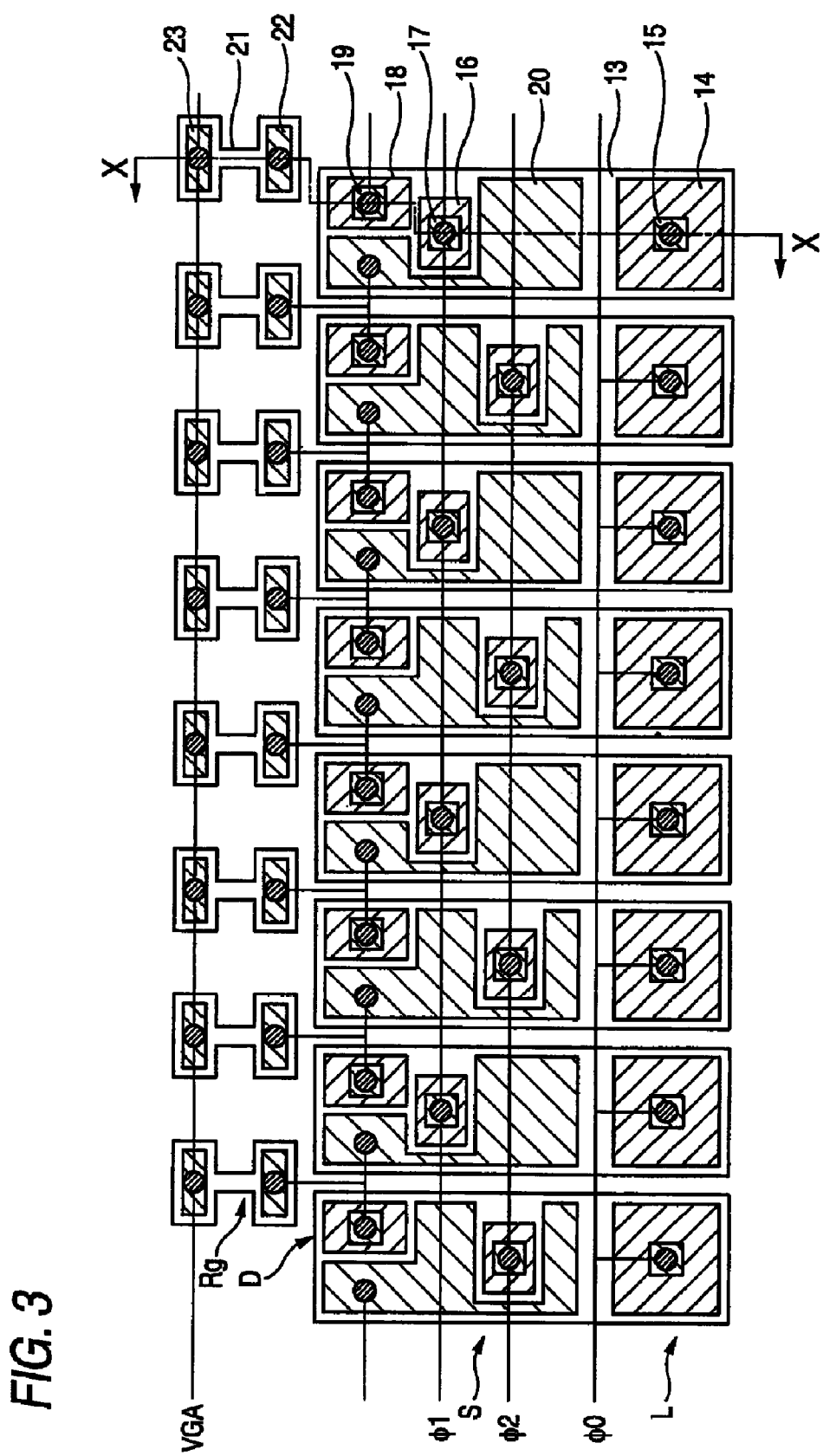
FIG. 3 is a diagram showing a plan view of a light-emitting element according to an exemplary embodiment.

FIG. 2 is a sectional view of a main part of the light-emitting element according to an exemplary embodiment. FIG. 3 is a plan view showing a plurality of light-emitting elements. This light-emitting element is of an anode-common type employing a p-type substrate 10.

On the p-type substrate 10, as shown in FIG. 2, a p-type epitaxial layer (anode layer) 11, an n-type epitaxial layer (n-type gate layer) 12, p-type epitaxial layers (p-type gate layers) 13 and 21, and n-type epitaxial layers (cathode layers) 14, 16, and 18 are stacked in this order. Numeral, mesa etching is performed so that a section 24 of sift section and light-emitting section is separated from a section 25 of gate load resistor.

In the section 24 of sift section and light-emitting section, the cathode layer 14 constitutes the cathode layer of the light-emitting thyristor L. The cathode layer 16 constitutes the cathode layer of the shift thyristor S. The cathode layer 18 constitutes the cathode layer of the coupling diode D.

Further, on the cathode layer 14, the cathode electrode 15 of the light-emitting thyristor L is formed. On the cathode layer 16, the cathode electrode 17 of the shift thyristor S is formed. On the cathode layer 18, the cathode electrode 19 of the coupling diode D is formed.

Further, also in the section 25 of gate load resistor Rg, on the p-type substrate 10, a p-type epitaxial layer 17, an n-type epitaxial layer 12, and a p-type epitaxial layer 21 are formed. Then, the p-type epitaxial layer 21 serves as the gate load resistor Rg. That is, on the p-type epitaxial layer 21, a pair of electrodes 22 and 23 are formed in a separate manner. Then, the p-type epitaxial layer 21 between these electrodes 22 and 23 serves as the gate load resistor Rg.

Further, on the rear surface of the p-type substrate 10, a back electrode (anode) 31 is formed and serves as the shift thyristor S and the anode of the light-emitting thyristor L. Furthermore, on the p-type epitaxial layer (gate layer) 13 in the section 24 of sift section and light-emitting section, a gate electrode 20 is formed and serves as the gate electrode of the common gate of the shift thyristor S and the light-emitting thyristor L.

As shown in FIG. 3, the electrode 23 of each gate load resistor Rg is connected to the power line VGA, while the gate electrode 20 is connected to the cathode electrode 19 of the adjacent element. Further, the cathode electrode 17 of the shift thyristor S is connected to the φ1 line φ1, while the cathode electrode 15 of the light-emitting thyristor L is connected to the signal line φs. Furthermore, in the adjacent light-emitting element, the cathode electrode 17 of the shift thyristor S is connected to the control line that is the φ2 line.

That is, as for the φ1 and φ2 lines, the φ1 line is connected to the cathode electrodes 17 of the odd-number-th ones of the light-emitting elements arranged in line, while the φ2 line is connected to the cathode electrodes 17 of the even-number-th light-emitting elements. Further, the cathode electrode 19 of each coupling diode D is connected to the gate electrode 20 of the adjacent element.

Then, in inter-electrode wiring, aluminum wiring traces are used. That is, an interlayer insulation film 41 is formed such as to cover the entirety of the light-emitting elements. Then, contact openings are formed in the interlayer insulation film 41 on the electrodes. After that, aluminum wiring traces 40 are formed such as to cover the contact openings in a pattern set up in advance.

Here, in the cathode electrodes 15, 17, and 19, the gate electrode 20, and the electrodes 22 and 23 of the gate load resistor which are formed on the cathode layer 14 and the gate layer 13, ohmic contact is achieved by employing gold electrodes made of metal including gold. For example, Au—Zn, Au—Ge, or Au—Ge—Ni may be included in the gold electrodes. When an aluminum electrode is formed directly on the gold electrode, in some cases, alloy formation between these electrodes causes contraction in the gold electrode in this part so as to result in an increase in the contact resistance or a reduction in the adhesion force. Thus, in the present exemplary embodiment, a barrier metal layer 42 is provided between the gold electrode and the aluminum electrode so as to suppress the alloy formation reaction so as to suppress the contact resistance increase and ensure the adhesion force. The barrier metal layer 42 is fabricated from refractory metal such as titanium (Ti) and molybdenum (Mo).

Further, in the present exemplary embodiment, the barrier metal layer 42 is formed in a limited vicinity of the contact opening. That is, when the barrier metal layer 42 is formed between the aluminum wiring trace 40 and the gold electrode and on the interlayer insulation film 41 in the vicinity, the region of formation is limited and hence the barrier metal layer 42 is not provided under the aluminum wiring trace 40 extending on the interlayer insulation film 41.

As a result, almost the entirety of the aluminum wiring trace 40 is formed directly on the interlayer insulation film 41. Thus, as for the design rule concerning the aluminum wiring trace 40, it is sufficient that the aluminum wiring trace 40 alone is taken into consideration.

Figure 4A:
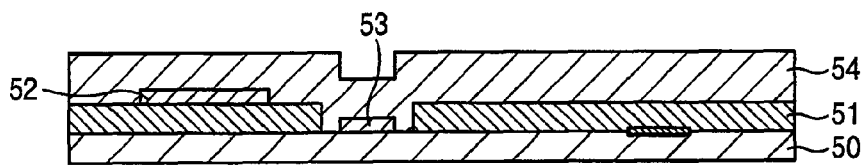
FIGS. 4A to 4I are diagrams describing fabrication processes for a light-emitting element according to an exemplary embodiment.

FIGS. 4A to 4I shows a formation method for a light-emitting element according to the present exemplary embodiment. This figure illustrates solely the part above the gate layer 50 (corresponds to the gate layer 13 in FIG. 2). As shown in FIG. 4A, on the gate layer 50, a cathode layer 51 (corresponds to the cathode layer 14 and the like) is formed. Then, on the cathode layer 51, a cathode electrode 52 (corresponds to the cathode electrode 15 and the like) is formed. Further, in a part where the cathode layer 51 is not formed on the gate layer 50, a gate electrode 53 (corresponds to the gate electrode 20) is formed. Then, an interlayer insulation film 54 is formed that covers the entirety and that is fabricated from insulating material. Further, the part where the cathode layer 51 is not formed forms a step part at a lower level than the other part. Thus, also in the interlayer insulation film 54, that part is depressed and forms a step part.

Figure 4B:
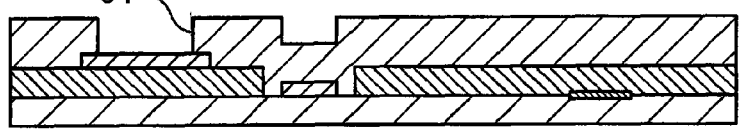
Figure 4C:
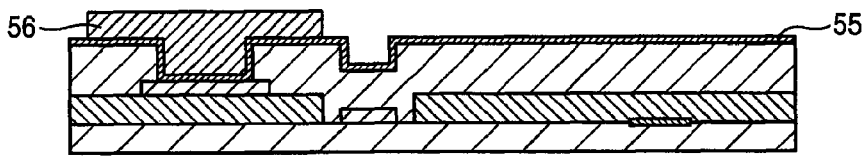
Figure 4D:
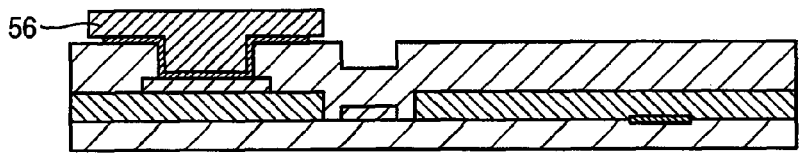
Figure 4E:
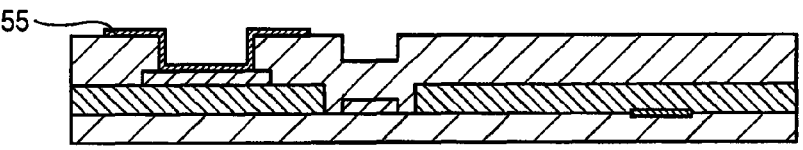

Then, as shown in FIG. 4B, as a result of patterning by photolithography performed on the interlayer insulation film 54, contact openings are formed and hence the upper surface of the cathode electrode 52 is exposed. Then, a barrier metal layer 55 is formed on the entire surface. After that, a resist 56 covering the contact openings is formed in the part where the barrier metal layer 55 is necessary (FIG. 4C). This resist 56 is processed by ordinary photolithography in which the necessary part of the resist formed on the entire surface is exposed and developed so that patterning is achieved. Then, the barrier metal layer 55 in the part not covered by the resist 56 is removed by wet etching using etching solution (D). As such, since the barrier metal layer 55 is removed by wet etching, the barrier metal layer 55 is formed somewhat smaller than the resist 56. Further, since the process is wet etching, the barrier metal layer 55 on the wall part of each recess in the interlayer insulation film 54 is removed also. After the barrier metal layer 55 other than the necessary part is removed, the resist 56 is removed (FIG. 4E).

Figure 4F:
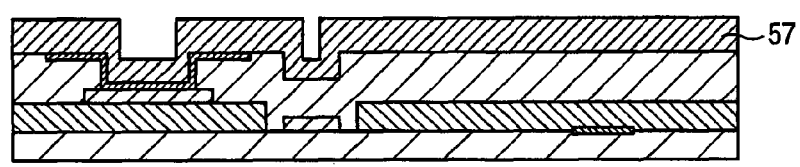
Figure 4G:
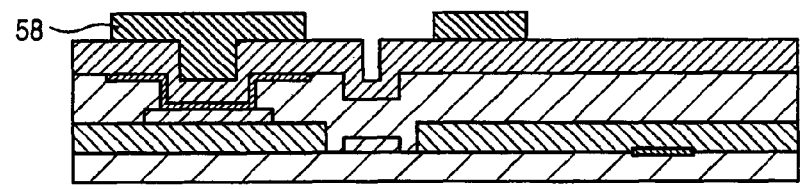
Figure 4H:
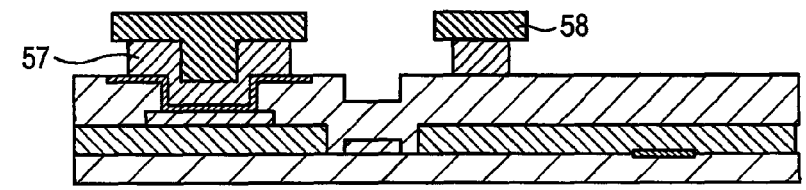
Figure 4I:
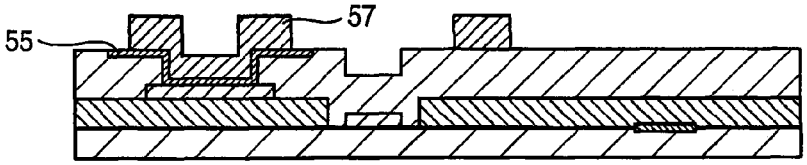

Then, an aluminum wiring layer 57 for wiring is formed on the entire surface (FIG. 4F). Then, a resist 58 is patterned in the necessary part by photolithography (FIG. 4G). Then, the aluminum wiring layer 57 in the exposed part is removed by wet etching (FIG. 4H). Also in this case, the aluminum wiring layer 57 is formed somewhat smaller than the resist 58. Further, since the process is wet etching, the aluminum wiring layer 57 on the wall part of each recess in the interlayer insulation film 54 is removed also.

Then, when the resist 58 is removed (FIG. 4I), the aluminum wiring layer 57 is formed into desired aluminum wiring traces. Further, since the aluminum wiring layer 57 is connected to the gold electrode 52 via the barrier metal layer 55, alloy formation between aluminum and gold is suppressed and hence satisfactory electric connection is obtained.

Figure 5:
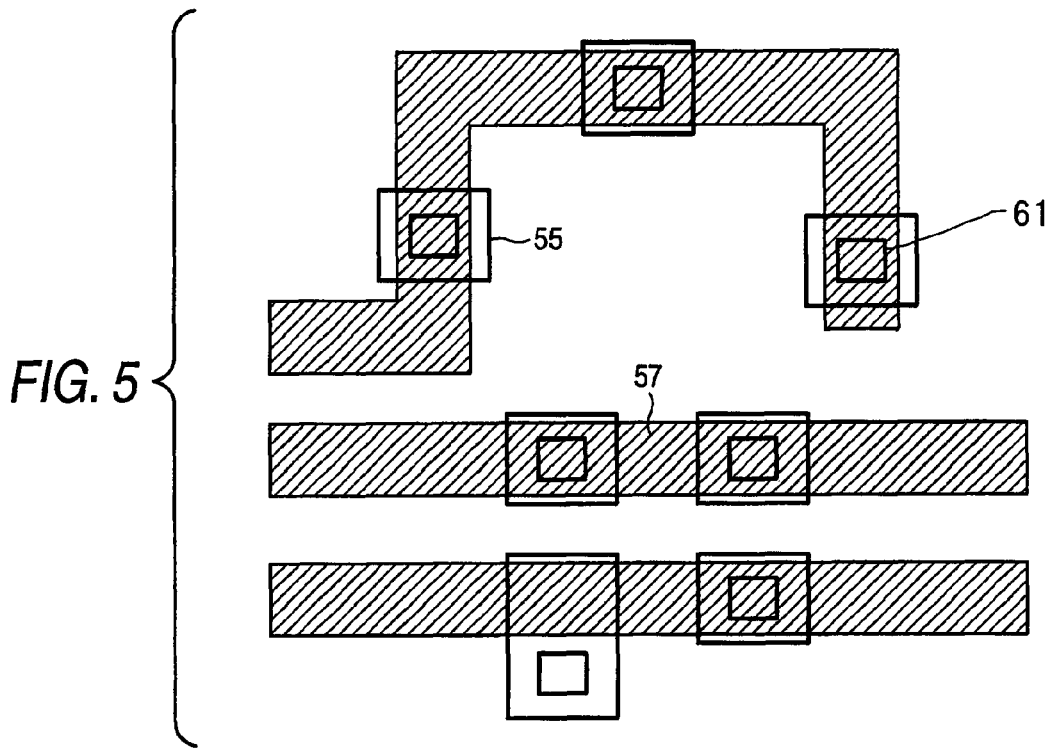
FIG. 5 is a diagram showing a wiring state of a light-emitting element according to an exemplary embodiment.
Figure 6A:
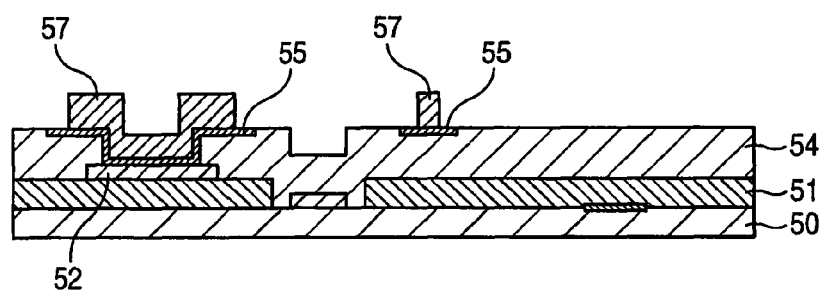
FIGS. 6A and 6B are diagrams showing configurations of a light-emitting element in a comparison example.
Figure 6B:
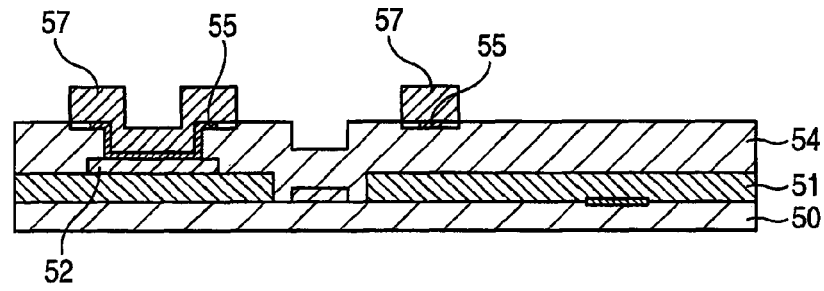

As such, patterning is performed on the barrier metal layer 55, the barrier metal layer 55 is formed in an arbitrary part alone. That is, in the present exemplary embodiment, as shown in FIG. 5, the barrier metal layer 55 is formed only within a limited region in the vicinity of each contact opening. In other words, a barrier metal layer 55 covers an upper face of the cathode electrode 52 and the interlayer insulation film 54 in a vicinity of the contact opening. The cathode electrode 52 may be the gold electrode. The barrier metal layer 55 is formed in a shape corresponding to the contact opening. The barrier metal layer 55 is not present under the ordinary part of the wiring trace of the aluminum wiring layer 57. Here, an alternative approach may be employed that patterning of the barrier metal layer 55 at the above-mentioned process steps shown in FIGS. 4D and 4E are omitted and that the aluminum wiring layer 57 and the barrier metal layer 55 are etched simultaneously. This comparison example is described below with reference to FIGS. 6A and 6B. In this case, since the aluminum wiring layer 57 and the barrier metal layer 55 have different etching rates from each other, the barrier metal layer 55 is formed somewhat larger (FIG. 6A) or smaller (FIG. 6B) than the aluminum wiring layer 57. When the barrier metal layer 55 is formed larger, since the barrier layer 55 is located under the entirety of the aluminum wiring layer 57, the wiring trace width becomes greater. Thus, in accordance with a design rule concerning the inter-wiring distance, line width reduction becomes difficult. In contrast, when the barrier metal layer 55 is formed smaller, a space is generated under the aluminum wiring layer 57. Thus, a part is generated that is not satisfactorily covered by a protective film formed in a subsequent process step.

Further, in the present exemplary embodiment, reactive ion etching (RIE) may be employed in the processing of the aluminum wiring layer 57 and the barrier metal layer 55. Since RIE serves as anisotropic etching, the aluminum wiring layer 57 and the barrier metal layer 55 can accurately be into an identical width. Nevertheless, as shown in FIGS. 4A to 4I, when a step part (recess) is present in the interlayer insulation film 54, a part not having been etched is generated in the step part in the aluminum wiring layer 57 and the barrier metal layer 55.

Figure 7A:
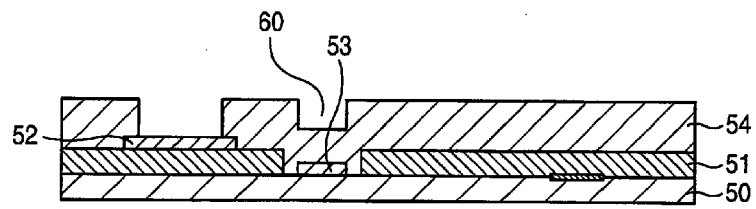
FIGS. 7A to 7F are diagrams describing fabrication processes in a comparison example.
Figure 7B:
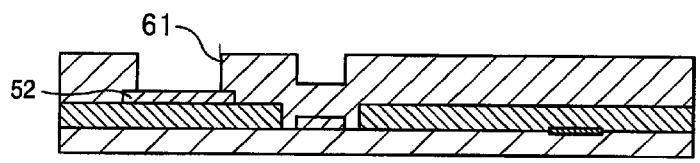
Figure 7C:
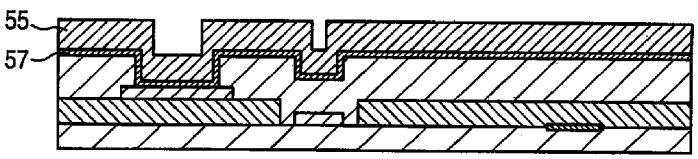
Figure 7D:
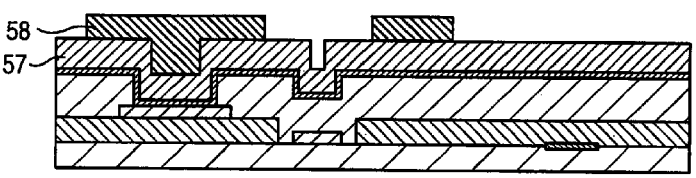
Figure 7E:
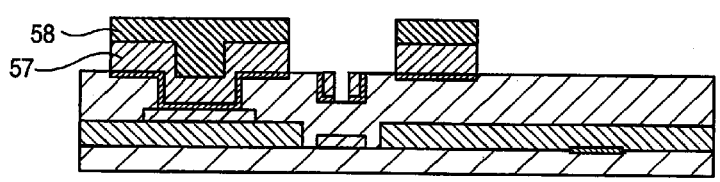
Figure 7F:
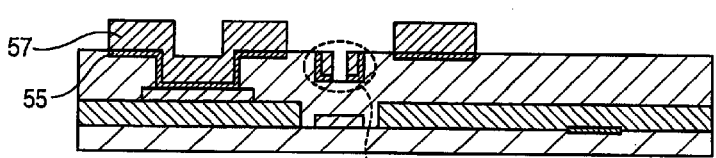

A comparison example to this is described below with reference to FIGS. 7A to 7F. As shown in FIG. 7A, a step part 60 is present on the gate electrode 53 of the interlayer insulation film 54. A contact opening is formed by RIE (FIG. 7B), and then a barrier metal layer 55 and an aluminum wiring layer 57 are fabricated (FIG. 7C). At that time, these layers are formed in similar thicknesses also in the contact opening and on the side wall of the step part 60. The resist 58 is patterned (FIG. 7D) and the aluminum wiring layer 57 and the barrier metal layer 55 are etched simultaneously by RIE (FIG. 7E). At that time, in the thick part of the aluminum wiring layer 57 near the wall of the step part 60, etching occurs in the same distance from the upper part. Thus, the aluminum wiring layer 57 and the barrier metal layer 55 remain partly, and hence conductive material remains in the step part 60 even after the removal of the resist 58.

Figure 8A:
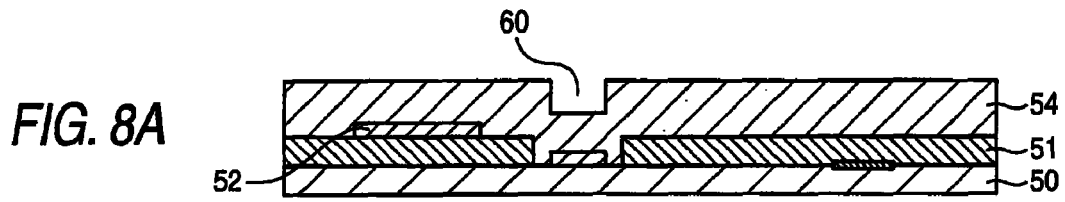
FIGS. 8A to 8G are diagrams describing fabrication processes in a comparison example.
Figure 8B:
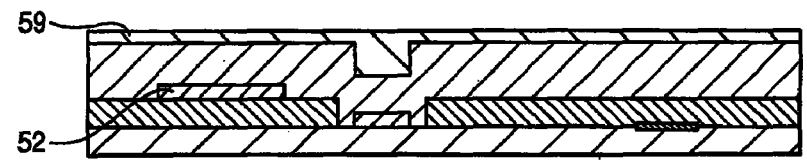

A comparison example to this is described below with reference to FIGS. 8A to 8G. As shown in FIGS. 8A and 8B, an alternative approach may be employed that flattening material is stacked on the interlayer insulation film 54 so that the surface is planarized. That is, a planarizing layer 59 is fabricated on the interlayer insulation film 54 having the step part 60. The planarizing layer 59 is in the form of liquid, and hence fills the step part 60 of the interlayer insulation film 54 by spin coat or the like so that the surface is planarized. Spin on glass film is widely used for the planarization.

Figure 8C:
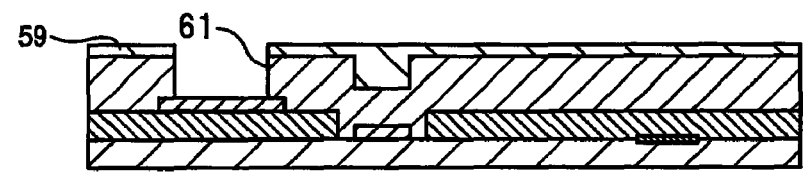
Figure 8D:
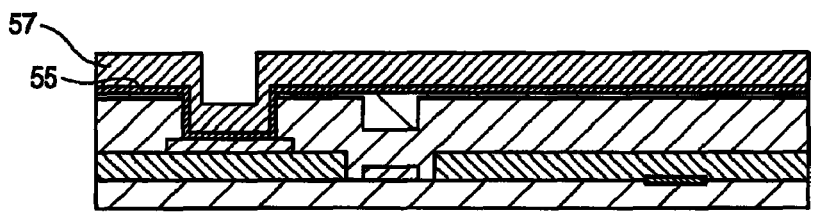
Figure 8E:
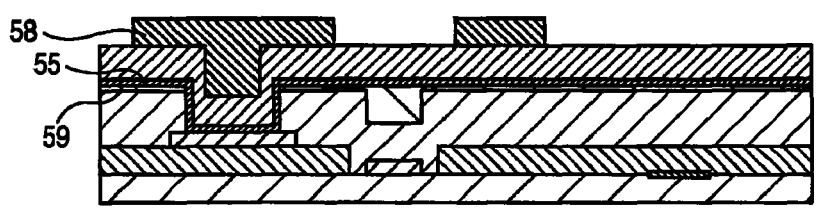
Figure 8F:
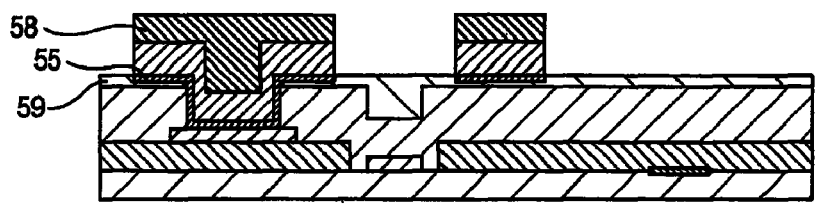
Figure 8G:
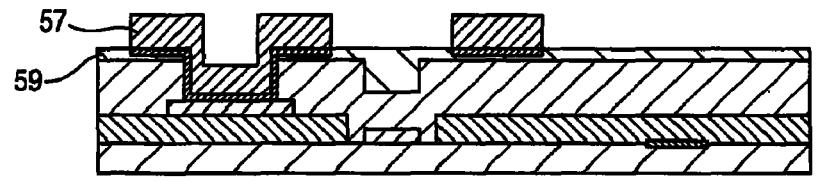

After the planarization, a contact opening is formed (FIG. 8C). Then, a barrier metal layer 55 and an aluminum wiring layer 57 are formed (FIG. 8D). Then, after the patterning of the resist 58 (FIG. 8E), the unnecessary and exposed part of the barrier metal layer 55 and the aluminum wiring layer 57 are etched by RIE (FIG. 8F). In this case, the to-be-removed part of the barrier metal layer 55 and the aluminum wiring layer 57 is formed in the form of a flat surface.

Nevertheless, since the flattening layer 59 composed of material of different kind is present on the interlayer insulation film 54, a greater film thickness is resulted. Further, a possibility of fluctuation in the effective refractive index arises.

Figure 9A:
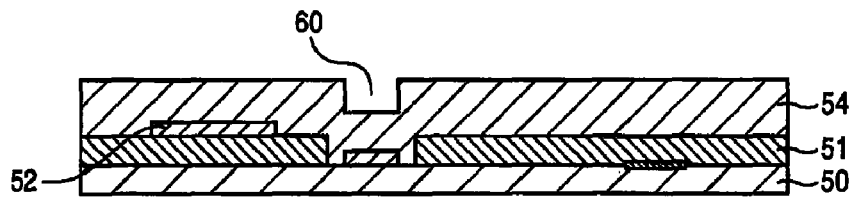
FIGS. 9A to 9H are diagrams describing fabrication processes in a comparison example.
Figure 9B:
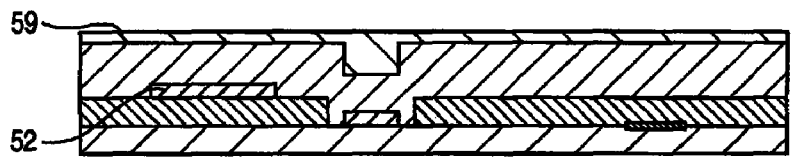
Figure 9C:
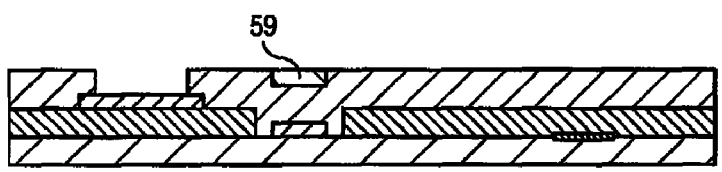
Figure 9D:
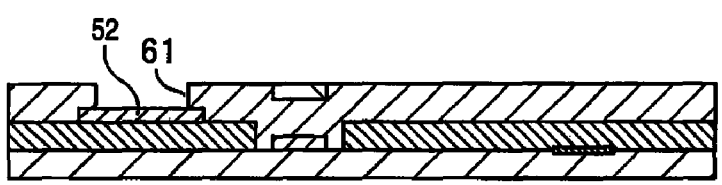
Figure 9E:
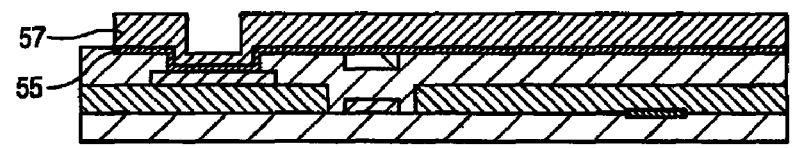
Figure 9F:
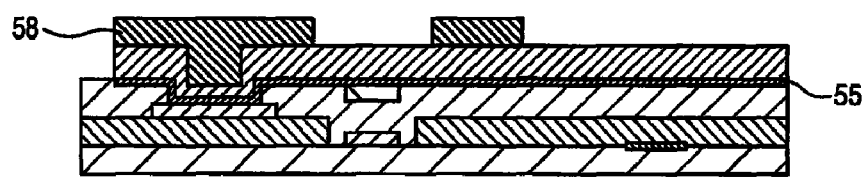
Figure 9G:
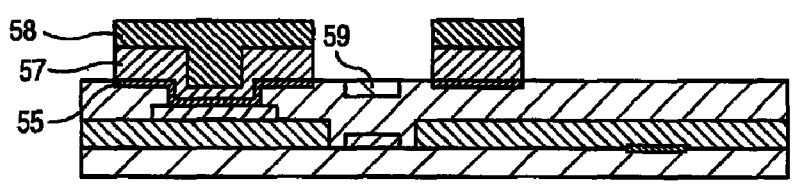
Figure 9H:
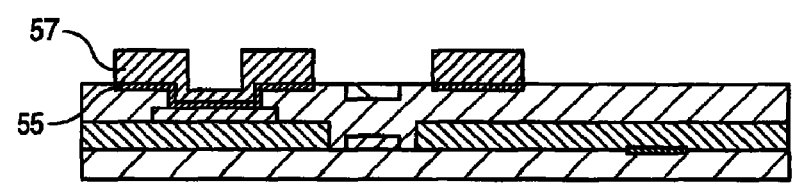

A comparison example to this is described below with reference to FIGS. 9A to 9H. As shown in FIGS. 9A to 9C, after the formation of the planarizing layer 59, the planarizing layer 59 may be etched by RIE. As a result, the entirety of the planarizing layer 59 is removed except for the planarizing layer 59 part in the step part 60. This avoids degradation in the optical characteristics that could be caused when the planarizing layer 59 were present. Nevertheless, in this fabrication method, at the time of removing the planarizing layer 59, the interlayer insulation film 54 need be removed to some extent. This causes difficulty in controlling the thickness of the interlayer insulation film 54.

In the present exemplary embodiment, a light-emitting element is obtained that has a barrier metal layer 55 located only in a contact opening and its vicinity and an ordinary aluminum wiring layer 57 formed in contact with the barrier metal layer 55. The aluminum wiring layer 57 and the barrier metal layer 55 are formed in process steps of photolithography and etching. Thus, the necessity of a planarizing process is unnecessary.

Here, the employed material for the metal barrier is, for example, titanium (Ti) or molybdenum (Mo). Further, a preferable film thickness of the barrier metal layer 55 is 20 to 100 nm or the like. Further, the employed method of film formation of the barrier metal layer 55 is evaporation or sputtering. In the etching of the titanium, for example, aqueous solution containing ammonia and hydrogen peroxide solution is used. At that time, in order that the optical characteristics of the light-emitting element should not be degraded, conditions are set up such that the interlayer insulation film part constituting the optical path is not eroded.

The aluminum wiring layer is formed in a film thickness of approximately 1 μm by evaporation or sputtering. In the etching, mixture liquid containing phosphoric acid, nitric acid, and acetic acid is used. Also at this time, in order that the optical characteristics of the light-emitting element should not be degraded, conditions are set up such that the interlayer insulation film part constituting the optical path is not eroded. Further, since the patterning is performed independently of that of the barrier metal layer, both patterns cross with each other or run in parallel. Thus, such conditions are preferable that the barrier metal layer is not eroded by the etching solution for aluminum wiring traces.

The light emitting element in the above exemplary embodiment is not limited to be used in an image forming apparatus using electrophotographic system. For example, the light emitting element may be used in, display, lighting, optical communication, and optical writing except electrophotographic recoding.

What is claim is:

1. A light-emitting element comprising:
   a semiconductor layer;
   a gold electrode layer that is formed on a part of the semiconductor layer and electrically connected to the semiconductor layer, the gold electrode layer being made of metal including gold;
   an insulator film that covers the semiconductor layer and has a contact opening corresponding to the gold electrode layer;
   a barrier metal layer that covers an upper face of the gold electrode layer and the insulator film in a vicinity of the contact opening; and
   an aluminum wiring layer that is formed on the barrier metal layer and electrically connected to the barrier metal layer, that extends on the insulator film in a direction departing from the vicinity, and that is made of metal including aluminum,
   wherein a lower surface of the aluminum wiring layer is in contact with the barrier metal pattern in the contact opening and in the vicinity of the contact opening, and extends in the direction in a state of contacting with the insulator film.

2. A fabrication method for a light-emitting element, the fabrication method comprising:
   forming an insulator film on a semiconductor layer on which a gold electrode layer is formed, the gold electrode layer being made of metal including gold;
   forming a contact opening in the insulator film so as to expose the gold electrode layer;
   forming a barrier metal layer that covers an upper face of the gold electrode layer and the insulator film in a vicinity of the contact opening; and
   forming an aluminum wiring layer that extends from a face of the barrier metal layer to and along a face of the insulator film in a direction departing from the vicinity so as to be electrically connected to the barrier metal layer and that is made of metal including aluminum,
   wherein a lower surface of the aluminum wiring layer is in contact with the barrier metal pattern in the contact opening and in the vicinity of the contact opening, and extends in the direction in a state of contacting with the insulator film.

3. The method according to claim 2, wherein the forming step of the barrier metal layer includes performing wet etching on the barrier metal layer.

4. The light-emitting element according to claim 1, wherein a shape of the barrier metal layer is formed by wet etching.

5. The method according to claim 2, wherein the gold electrode layer is disposed between the semiconductor layer and the insulator film after the forming step of the insulator film.

* * * * *